(12) United States Patent
Vest et al.

(10) Patent No.: US 8,739,701 B2
(45) Date of Patent: Jun. 3, 2014

(54) METHOD AND APPARATUS FOR THERMAL PROCESSING OF PHOTOSENSITIVE PRINTING ELEMENTS

(76) Inventors: Ryan Vest, Cumming, GA (US); Brian Cook, Roswell, GA (US); Jim Hennessy, Woburn, MA (US); David Elwell, Smyrna, GA (US)

( * ) Notice: Subject to any disclaimer, the term of this patent is extended or adjusted under 35 U.S.C. 154(b) by 988 days.

(21) Appl. No.: 12/183,461

(22) Filed: Jul. 31, 2008

(65) Prior Publication Data

US 2010/0024672 A1    Feb. 4, 2010

(51) Int. Cl.
B41N 6/00    (2006.01)
G03F 7/00    (2006.01)

(52) U.S. Cl.
USPC ..................... 101/463.1; 101/401.1

(58) Field of Classification Search
USPC ........................... 101/463.1, 401.1
See application file for complete search history.

(56) References Cited

U.S. PATENT DOCUMENTS

| | | | |
|---|---|---|---|
| 4,081,815 A | 3/1978 | Horner | |
| 4,196,018 A | 4/1980 | Inoko et al. | |
| 4,450,486 A * | 5/1984 | Buechler | 358/3.29 |
| 4,977,058 A | 12/1990 | Miyagawa et al. | |
| 5,085,962 A | 2/1992 | Aslam et al. | |
| 5,175,072 A | 12/1992 | Martens | |
| 5,262,275 A | 11/1993 | Fan | |
| 5,279,697 A | 1/1994 | Peterson et al. | |
| 5,468,568 A * | 11/1995 | Kuhn et al. | 428/35.9 |
| 5,679,485 A | 10/1997 | Suzuki et al. | |
| 5,768,995 A * | 6/1998 | Miyaguchi et al. | 430/49.2 |
| 5,925,500 A | 7/1999 | Yang et al. | |
| 6,130,185 A * | 10/2000 | Narita et al. | 503/227 |
| 6,171,758 B1 | 1/2001 | Bhateja et al. | |
| 6,238,837 B1 | 5/2001 | Fan | |
| 6,425,327 B1 * | 7/2002 | Fan et al. | 101/401.1 |
| 6,605,410 B2 | 8/2003 | Yang et al. | |
| 6,794,454 B2 | 9/2004 | Kataoka | |
| 6,881,526 B2 * | 4/2005 | Bobeck et al. | 430/30 |
| 6,998,218 B2 | 2/2006 | Markhart | |
| 7,041,432 B2 | 5/2006 | Markhart | |
| 7,044,055 B2 * | 5/2006 | Gotsick et al. | 101/401.1 |
| 7,081,331 B2 | 7/2006 | Vest | |
| 7,152,529 B2 | 12/2006 | Gotsick et al. | |
| 7,202,008 B2 | 4/2007 | Roshelli, Jr. et al. | |
| 7,232,649 B2 | 6/2007 | Vest | |
| 7,237,482 B2 * | 7/2007 | Vest et al. | 101/401.1 |
| 7,241,124 B2 | 7/2007 | Roberts et al. | |
| 7,358,025 B2 | 4/2008 | Hatakeyama | |
| 2002/0069777 A1 * | 6/2002 | Rossini et al. | 101/401.1 |

* cited by examiner

*Primary Examiner* — Judy Nguyen
*Assistant Examiner* — Shema Freeman
(74) *Attorney, Agent, or Firm* — Carmody Torrance Sandak & Hennessey LLP

(57) ABSTRACT

The present invention pertains to a process and an apparatus for treating a photosensitive element to form a relief structure suitable for flexographic printing plate. The apparatus comprises an enclosure, a conveyor, a heatable roller with absorbent material conducted over it, and a roller that can significantly smooth or uniformly roughen the relief structure of the flexographic printing plate. Previously selectively cured photosensitive elements are developed by means of the heatable roller by blotting with the absorbent material, and the resulting relief structure is made uniform by way of a smoothing or roughening roller. The flexographic plates produced by the method and apparatus are especially suited to processes that require substantially smoothed or uniformly roughened printing plate surfaces, which are capable of producing better quality printing.

42 Claims, 1 Drawing Sheet

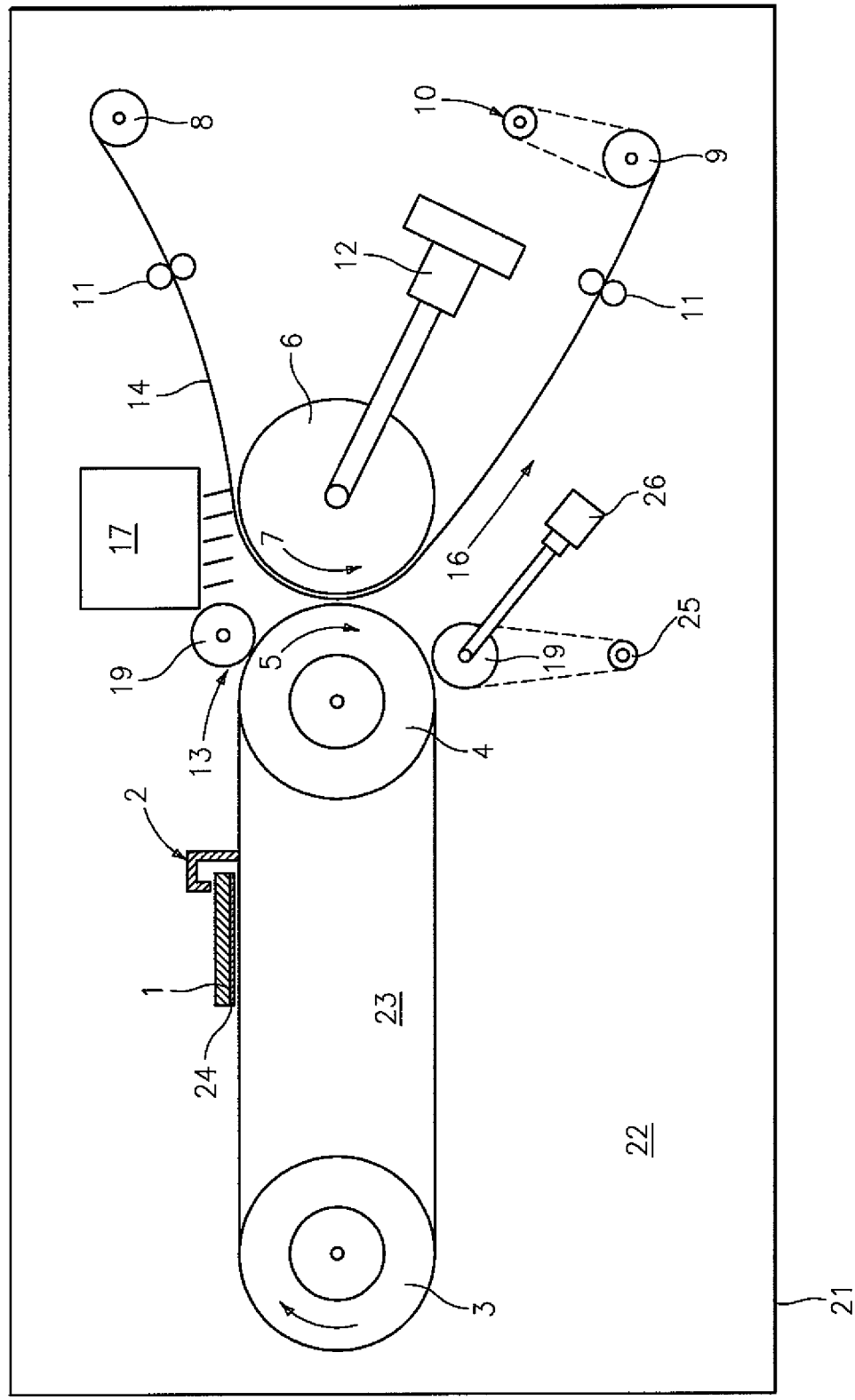

METHOD AND APPARATUS FOR THERMAL PROCESSING OF PHOTOSENSITIVE PRINTING ELEMENTS

FIELD OF THE INVENTION

The present invention pertains to a process and apparatus for thermally treating a photosensitive element to form a relief structure suitable for flexographic printing. The flexographic plates produced by the method and apparatus are especially suited to processes that require substantially smoothed or uniformly roughened printing plate surfaces.

BACKGROUND OF THE INVENTION

Flexography is a method that is commonly employed for printing on a variety of substrates such as paper, paperboard stock, corrugated board, films, foils, and laminates. Newspapers and paper cups are prominent examples. Flexographic printing plates are relief plates with image elements raised above open areas. Such plates offer a number of advantages to the printer, based chiefly on their durability and the ease with which they can be made.

Photosensitive elements generally have a layer or layers of a photopolymerizable composition interposed between a support and a coversheet or a multilayer cover element. Upon imagewise exposure to actinic radiation, polymerization, or photocuring of the photopolymerizable layer occurs in the exposed areas. It is then required that these plates be developed, and it is commonly known to the art to treat them with a solvent or aqueous based washout to remove the unexposed areas of the photopolymerizable layer leaving a printing relief which can be used for flexographic printing. Alternatively, it is known to the art to utilize a "dry" thermal development, in which the differences in melting temperature between the polymerized and unpolymerized portions of the plate are exploited to leave behind the appropriate relief structure.

Many flexographic plate producers use high pressure water spray to process their printing plates. Examples of these systems are described in U.S. Pat. No. 4,196,018 to Inoko et al. and U.S. Pat. No. 4,081,815 to Horner. These processes, while effective in removing the uncured photopolymer, have a number of deficiencies. First, this approach requires plumbing to transport the water to the process and energy to heat this water. Also, the process generates aqueous effluent, which must then be disposed. Often, treatment is needed before the effluent is disposed of, adding to the expense. However, most importantly for the present invention, the high pressure water spray is ineffective in creating a change in the surface of the cured photopolymer. Importantly, the producers of these flexographic plates are unable to accurately regulate the surface roughness of the relief structure, whether to make it substantially smooth or to have a uniform surface roughness.

"Dry" thermal development is a process that has been gaining popularity for the production of flexographic plates. It is a user friendly process that produces a high quality plate. The basic parameters of the process are well known to the art, as described in U.S. Pat. No. 5,175,072 to Martens. These processes allow for the elimination of development solvents and the lengthy drying times needed to remove the solvent. Dry blotting is used to remove the uncured and melted photopolymer, leaving behind the cured photopolymer with the higher melting temperature so that a relief structure is formed. However, just as with the solvent method of development, the producers of these flexographic plates are unable to effectively regulate the surface roughness of the relief structure. The blotting rollers only function to remove the uncured photopolymer, and for a variety of reasons cannot reliably change the surface structure.

U.S. Pat. No. 5,279,697 to Peterson et al. and U.S. Pat. No. 7,241,124 to Roberts et al. depict typical thermal development devices using a hot roller and an absorbent material that is contacted with the heated printing plate. The absorbent material consists of a heated webbing that allows for the softened or liquefied photopolymer to be absorbed into the web.

The present invention provides a novel system for the thermal based development of flexographic printing plates that overcomes many of the disadvantages of the prior art.

The present invention is directed to a novel process and apparatus for thermally developing flexographic printing plates comprising the use of a roller or other means that substantially changes the surface formation of the cured photopolymer to become either smoothed or roughened and preferably uniformly smoothed or uniformly roughened. This roller can be placed either before or after (preferably after) the previously mentioned blotting rollers and can be either coated with a resilient surface such as TEFLON® or rubber or uncoated. Unlike thermal development systems of the prior art, the system of the present invention achieves a substantially uniform surface formation in the relief structure that aids in uniform printing.

The present invention also provides a novel system for the solvent based development of flexographic printing plates that overcomes many disadvantages of the prior art. The spraying of water or other solvents on the cured and uncured photosensitive elements does not reliably effect a change in the surface formation of the relief structure. As with thermal development, solvent based development is only aimed at removing the uncured photopolymer, and does not effect a substantial smoothing or uniform roughening in the relief structure of the plate.

Furthermore, customers frequently demand that flexographic printing elements be suitable both for thermal development and for development by means of solvents. However, the surfaces of the relief structures formed by these two methods are not necessarily similar, and these differences would lead to inconsistent coatings, especially if both thermal and solvent developed printing plates are used to print the same patterns. The addition of a roller that does not comprise a blotting system, but which aims at improving the surface formation of the relief structure, overcomes disadvantages in the prior art. Using this, the relief structures of the printing plates can be smoothed so that when the image is printed, it is uniform regardless of the type of development it went through.

SUMMARY OF THE INVENTION

It is an object of the present invention to provide either a thermal or solvent based developing system that can process photosensitive elements such that the resulting relief structure is uniform and preferably smooth to effect more efficient and higher quality printing.

It is another object of the present invention to provide a thermal developing system that can be used in the manufacture of photosensitive flexographic printing plates, which require a high degree of uniformity and smoothness in the relief structure to effect efficient, detailed, and high quality images upon printing.

To that end, the system of the invention generally comprises a conveyor comprising a continuous loop wherein the photosensitive printing element is positioned on the continuous loop of the conveyor; a heatable roller capable of being urged towards the photosensitive printing element positioned on the conveyor, wherein an absorbent material is conducted over at least a portion of an outer surface of the heatable roller, and wherein the absorbent material is capable of absorbing material that is liquefied or softened from the photosensitive printing element when the heatable roller is heated and rotates and the absorbent material contacts at least a portion of the photosensitive printing element; delivery means for supplying the absorbent material to at least the portion of the outer surface of the heatable roller; means for causing the at least one layer of photosensitive material and the absorbent material to come into contact at a point between the conveyor and the heatable roller such that at least a portion of the liquefied or softened material is absorbed by the absorbent material; and additional means of smoothing or roughening the photosensitive printing element so that the relief structure is substantially free of deformations or cracks to effect uniform ink coating in the printing process.

In a preferred embodiment, the smoothing means is provided by a roller coated with a resilient surface such as TEFLON®/rubber or rubber, wherein the photosensitive printing element is conducted over the outer surface of the roller, and wherein the roller is heated such that the pressure applied by the roller is able to smooth and correct imperfections in the relief structure without disturbing the relief pattern itself.

BRIEF DESCRIPTION OF THE DRAWINGS

For a fuller understanding of the invention, reference is had to the following description taken in connection with the accompanying figure, in which:

FIG. 1 is a cross sectional view of the thermal developing system of the invention.

While not all elements are labeled in each figure, all elements with the same reference number indicate similar or identical components.

DETAILED DESCRIPTIONS OF THE PREFERRED EMBODIMENTS

Although this method and apparatus can be applied to a solvent based development process, the invention is preferably embodied as a thermal based development process due to its preferable use of heat in the smoothing process. One such process is described in U.S. Pat. No. 7,044,055 to Gotsick et al.

As depicted in FIG. 1, the present invention is directed to an apparatus 21 and method for forming a relief image on a photosensitive printing element 1. The apparatus (plate processor) 21 comprises an enclosure 22 for housing the elements of the thermal plate processing system.

The plate processor 21 accepts a previously formed and imaged flexible photosensitive printing element 1 with flexible substrate 24. This photosensitive printing element would have previously been imaged by selective exposure to actinic radiation, curing the photopolymer in the appropriate places to form the desired pattern. It is preferable to have used an infrared sensitive layer, which is used to form an in situ mask on the areas of the photosensitive element that are not desired to be polymerized. This layer will be easily removed in the development process, so its use is of no consequence to the present invention. Suitable photosensitive printing elements usable in the present invention include those described in U.S. Pat. No. 5,175,072 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety. Preferably the photosensitive printing element comprises a flexible substrate 24, a radiation curable layer (photopolymer layer) and an IR ablatable layer. A portion of the radiation curable layer is preferably cured by actinic radiation through the lower surface of the base to form a cured "floor." This floor gives stability to the printing plate, and yields the base from which the relief structures rise.

A conveyor 23 attached to a drive motor (not shown) is used to transport and convey the photosensitive printing element 1, which is aligned such that the flexible substrate layer 24 faces the conveyor 23 and the side with both cured and uncured portions faces away from the conveyor. The photosensitive printing element is held on the conveyor by a fastening means 2, which could be a clamp, or any other means for holding the photosensitive printing element 1 securely on the conveyor 23. The conveyor 23 is mounted in a fixed position in the enclosure 22, and comprises a continuous loop that is preferably supported by at least a first roller 3 and a second roller 4. In a preferred embodiment, the continuous loop of the conveyor 23 comprises a wire mesh.

During operation, the conveyor 23 moves with the photosensitive printing element 1 in a first direction 13 towards the heatable roller 6, such that the photosensitive printing element 1 passes in-between the conveyor 23 and the heatable roller 6. If used, second roller 4 must rotate in the appropriate direction 5, and the heatable roller must rotate in the opposite direction 7. The heatable roller 6 is preferably capable of being moved in a direction that is either directly closer to or further from the conveyor 23. Most preferably, the heatable roller 6 is mounted on a pivot (not shown), which allows it to be moved towards the conveyor 23.

In a preferred embodiment, the heatable roller 6 is moved toward the conveyor 23 using suitable means, such as a pneumatic cylinder 12. This pneumatic cylinder 12 positions the heatable roller 6 at a specific distance from the conveyor 23 in order to achieve the desired contact the photosensitive printing element 1 as it travels in-between the conveyor 23 and the heatable roller 6.

A webbing of absorbent material 14 is conducted over at least a portion of the surface of the heatable roller 6. This web 14 is capable of absorbing material that is liquefied or softened from the photosensitive printing element 1. This absorption is effected when the photosensitive printing element 1 passes between the conveyor 23 and the heatable roller 6, where the absorbent webbing 14 comes into pressurized contact with the photosensitive printing element 1. This contact is achieved by setting the pneumatic cylinder 12 to a position such that the gap between the conveyor 23 and the heatable roller 6 is sufficiently small such that when the photosensitive printing element 1 passes between the two, contact is achieved. By effectuating this contact between the photosensitive printing element 1 and the webbing 14 on the heatable roller 6, at least a portion of liquefied or softened material on the upper surface of the photosensitive printing element 1 is absorbed by the web 14 and removed.

Heat is provided to the heatable roller 6 by a core heater that is capable of maintaining an outer temperature that will soften or liquefy at least a portion of the photosensitive material 1. This temperature must be chosen based on the composition of the photosensitive material and should be based on the melting temperature of the polymers contained within the photosensitive material. As it is an object of the present invention to remove the unpolymerized material to make a relief structure comprised of polymerized photosensitive material, this temperature should be chosen such that it is as high or higher than the melting temperature of the uncured photopolymer but lower tan the melting temperature of the cured photopolymer. Typical temperatures for this heatable roller range from 100° C. to 250° C., but these temperatures should also not exceed the melting temperature of the absorbent web 14 itself or the substrate layer. Although the heatable roller 6 preferably comprises an electrical core heater to provide the desired outer temperature, the use of steam, oil, hot air, and a variety of other heating sources may also provide the desired outer temperature.

The web of absorbent material 14 is supplied to at least a portion of the outer surface of the heatable roller 6 from a supply roil 8 of the web of absorbent material 14. The specific type of absorbent material is not critical to the present invention. The selection of the absorbent material 14 depends in part upon the thickness of the photosensitive printing element 1 to be processed, the melting temperature of the web of absorbent material 14, and the heat transfer characteristics of both the photosensitive printing element 1 and the web of absorbent material 14.

The web of absorbent material 14 is moved along the system which originates at the supply roll 8 and terminates at the take-up roller 9. Suitable means for maintaining uniform tension in the web of absorbent material 14 throughout this system may be used. Such means may be one or more sets of idle rollers 11 mounted at various places along the system. Other means for maintaining tension in the web may also be provided and would be known to those skilled in the art. The speed of the absorbent web 14 movement may be regulated by a motor 10, which should be set to not interfere with the selected web tension. If the motor does interfere with the tension, the resulting flexographic plate could potentially have variable heights in its relief structure and could warp and be commercially unacceptable. It is also critical that the linear speed of the heatable roller 6, the web of absorbent material 14, and the photosensitive printing element 1 be substantially the same to avoid shear stress on the photosensitive printing element 1, which could result in similar deformities as poorly regulated motor 10 speed.

The system may also have ventilation means (not shown) connected to the enclosure 22. These means would be operative in removing volatile organic compounds and other contaminants. These means are known to the art and are adequately described in U.S. Pat. No. 7,044,055 to Gotsick et al. It is also possible, and preferable, to provide additional heating means to further soften and liquefy portions of the photosensitive printing element 1. Such means may comprise an IR heater 17, which has generally been placed so as to heat the photosensitive printing element 1 before it contacts the absorbent web 14. However, as it may be preferable in the present invention to provide heating means after contact with the absorbent web 14, this heating element 17 may be positioned accordingly.

The system further comprises at least one smoothing or roughening roller 19, which comes into contact with the side of the photosensitive printing element 1 that contacted the absorbent web 14. The portion of this roller 19 that comes into contact with the photosensitive printing element 1 should not be in contact with the absorbent web 14 at that time. Thus, the result is that the photosensitive printing element 1 comes into contact with the surface of the at least one smoothing roller 19 on the same side that it is to come, or preferably came, into contact with the web. This contact should not involve contact of the absorbent web with either the photosensitive printing element 1 or the roller 19. This additional contact can be made either before or after the photosensitive printing element comes into contact with the heatable roller 6 and the absorbent web 14 but is preferably after the contact with heatable roller 6. This contact may also accompany contact with another roller, or with a hard surface, in the system 21, and the result must be that pressure is exerted between the at least one smoothing or roughening roller 19 upon the photosensitive printing element. This hard surface could be a second smoothing roller 19 or the conveyor 23. It is an object of the present invention that this contact be made with enough pressure and/or heat to alter the surface roughness of the resulting relief structure such that the arithmetical mean roughness ("Ra") of the printing plate is changed by at least 5 nm. Thus, a change in the Ra of the relief structure having a magnitude of at least 5 nm will be defined as significant change. Additional change will also be said to mean change in the surface of the relief structure that is not effectuated by the heatable roller 6, any absorbent material 14 or any other element of the apparatus other than the at least one smoothing or roughening roller 19.

In a preferred embodiment of the present invention, contact with the at least one smoothing or roughening roller 19 occurs after the photosensitive printing element 1 contacts the heatable roller 6 and the absorbent web 14. The result is that the photosensitive printing element 1 travels under the outer rim of the at least one smoothing or roughening roller 19, preferably between the conveyor 23 and the at least one smoothing or roughening roller 19. It is important to ensure that the photosensitive printing element 1 does not come into contact with the absorbent web 14 when it passes in-between the conveyor and the at least one smoothly roller.

Optionally, the at least one smoothing roller may be heated, in a similar fashion as the heatable roller 6. However, since roller 19 contacts the surface of the photosensitive printing element 1 that most needs smoothing, it is preferable that at least 19 be heated, though this is not necessary to achieve the desired effect. It is also preferable to attach an additional pneumatic cylinder 26 (or more) to at least one of the smoothing or roughening rollers 19. In a preferred embodiment, a pneumatic cylinder 26 positions the smoothing or roughening roller 19 at a specific distance from conveyor 23 in order to achieve the desired pressure on the photosensitive printing element 1 as it travels in-between the conveyor 23 and the smoothing or roughening roller 19. Thus, through a combination of heat and pressure, the at least one smoothing roller are able to significantly change the surface roughness of at least one side of the photosensitive printing element 1.

It is also preferable that the at least one smoothing or roughening roller 19 be coated with a resilient surface. Possible resilient surfaces are TEFLON® (fluorinated polymer), rubber, or a TEFLON®/rubber composite. Coating a heatable or non-heatable roller with such surfaces would be well known to someone skilled in the art. It is also possible to drive the rotation of one or more of the smoothing or roughening rollers 19 by use of motor 25. The contact with the at least one smoothing or roughening roller should have the effect of changing the arithmetical mean roughness of the surface of the printing element by at least 5 nm, preferably 10-2000 nm, more preferably 100-1000 nm and most preferably 150-600 nm. The preferred result is for the at least one smoothing or roughening roller to not only change the arithmetical mean roughness of the surface of the printing element but to uniformize the surface roughness of the printing element.

In addition, a controller, such as a microprocessor may be used in the system of the invention to control the operation of each of the elements in the plate processor 21. Such controllers are well known to the art. One example of a controller used to control the various elements in a plate processor is described in U.S. Pat. No. 5,279,697 to Peterson et al., the subject matter of which is herein incorporated by reference.

The present invention is also directed to a method of forming a relief image on a photosensitive printing element, wherein the photosensitive printing element comprises a flexible substrate and at least one layer of photosensitive material deposited on the flexible substrate using the system described above.

The method comprises the steps of (1) providing an enclosure; (2) providing conveying means comprising a continuous loop, upon which a photosensitive printing element is supported; (3) providing a mounted heatable roller in the enclosure; (4) providing an absorbent material to at least a portion of the heatable roller, wherein the absorbent material is capable of absorbing liquefied or softened material from a heated photosensitive printing element when the photosensitive printing element comes into contact with the absorbent web on a portion of the heatable roller; (5) causing the photosensitive printing element to come into contact with the heatable roller where there is absorbent material; (6) heating the heatable roller to a temperature that causes at least a portion of the photosensitive printing element to liquefy or soften when contact between the heatable roller and the photosensitive printing element is made; (7) causing the same side of the photosensitive printing element that contacted the heatable roller to contact at least one smoothing roller that additionally and significantly changes the surface roughness of the photosensitive printing element.

Preferably, the photosensitive printing element is processed through the steps of the process several times so that most, if not all of the uncured photosensitive material can be removed from the surface of the photosensitive printing element to obtain the relief image. It is also possible and preferable to process the photosensitive printing element multiple times where the printing element does not come into contact with the heatable roller at all and only the smoothing or roughening process occurs. Additionally, all of the preferable and optional elements of the apparatus previously described may be employed in this method.

In the case of the solvent developed printing element, the printing element is first imaged and then developed by exposing it to a solvent which will selectively dissolve unpolymerized areas of the printing element while leaving polymerized areas in tact. The printing element is then subjected to the apparatus of this invention except that in this case the apparatus does not need rolls 6, 8 and 9 as well as the absorbent material 14, pneumatic cylinder 12 and motor 10.

The smoothing process is advantageous to the processing of photosensitive printing elements because uniform relief structure results in a better quality of printing. It is also possible to achieve artistic or aesthetically pleasing printing effects by providing a surface on the smoothing rollers that will uniformly roughen or smooth the relief structure of the photosensitive printing element.

The process of the proposed invention is further described by the following examples which are intended merely for additional description but are not limiting in any way.

EXAMPLE 1

Several photosensitive printing elements are prepared that are capable of undergoing thermal development, containing actinic radiation polymerized portions and non-polymerized portions. For this purpose Digital MAX photopolymer printing elements (available form MacDermid Printing Solutions, LLC.) were selectively ablated in the desired image with an IR laser and then exposed to U.V. radiation through the in-situ mask thereby creating polymerized and unpolymerized areas. These types of thermally developable plates are well known to the art, and any such type of plate would be well suited for this invention and yield comparable results. The type of photopolymer is generally not important.

These plates are thermally developed using the preferred apparatus described above, in which the heatable roller is heated to 145° C. A 2 kw I.R. heater was also used to pre-heat the printing element and from 1-5 passes through the process were employed until the unpolymerized areas were removed. The photosensitive printing element is processed through the steps of the process several times so that most, if not all of the uncured photosensitive material is removed from the surface of the photosensitive printing element to obtain the relief image.

The relief image is examined under a microscope and the surface is scanned using a standard profiameter. The arithmetical mean roughness of the relief structure is determined. It is found to be 1333.31 nm.

EXAMPLE 2

Photosensitive printing elements are prepared and developed in the same manner as Example 1 except for the use of an uncoated smoothing hot roller and the temperature of the heatable roller with the absorbent material is set to 170° C. The surface of the smoothing roller is smooth and it is heated to 170° C. The photosensitive printing element is contacted with the smoothing roller once after it has already been contacted with the absorbent material and the heatable roller. The arithmetical surface roughness of the relief structure is again determined in the same manner as Example 1. It is found to be 1279.69 nm.

EXAMPLE 3

Photosensitive printing elements are prepared and developed in the same manner as Example 2, except the printing elements are now contacted with the smoothing roller a total of 4 times consecutively. The arithmetical surface roughness of the relief structure is determined in the same manner as Example 1. It is found to be 987.14 nm.

EXAMPLE 4

Photosensitive printing elements are prepared and developed in the same manner as Example 3, except after the fourth pass with the 170° C. smoothing roller, the temperature of the smoothing roller is increased to 180° C., and the printing elements are contacted two more times with this roller. The arithmetical surface roughness of the relief structure is determined in the same manner as Example 1. It is found to be 941.34 nm.

The following chart summarizes the results of the preceding examples:

TABLE I

| Example | Arithmetical Surface Roughness (nm) |
|---|---|
| 1 | 1333.31 |
| 2 | 1279.69 |
| 3 | 987.14 |
| 4 | 941.34 |

Thus, it is seen that the use of at least one smoothing roller without an absorbent web can significantly change the relief structure of the photosensitive printing elements. Temperature and the number of repeated passes through the smoothing roller are the factors the most affect the process. Since multiple passes through the smoothing roller seem to be preferable, it is conceivable to design a thermal development apparatus with a number of smoothing rollers consecutively lined to treat the photosensitive printing element.

While the invention has been described above with reference to specific embodiments thereof, it is apparent that many changes, modifications, and variations can be made without departing from the inventive concept disclosed here. Accordingly, it is intended to embrace all such changes, modifications, and variations that fall within the spirit and broad scope of the appended claims.

What is claimed is:

1. An apparatus for forming a relief structure on a flexographic photosensitive printing element, wherein the flexographic photosensitive printing element comprises a flexible substrate and at least one layer of photosensitive material comprising cured photosensitive material and uncured photosensitive material on the flexible substrate, the apparatus comprising:
   (i) an enclosure;
   (ii) conveying means comprising a continuous loop, upon which a flexographic photosensitive printing element can be supported;
   (iii) a mounted heatable roller in the enclosure;
   (iv) an absorbent material covering at least a portion of the heatable roller, wherein the absorbent material is capable of absorbing liquefied or softened uncured photosensitive material from the flexographic photosensitive printing element when the flexographic photosensitive printing element comes into contact with the absorbent material on a portion of the heatable roller;
   (v) a smoothing or roughening roller which changes the surface roughness of the cured photosensitive material of the flexographic photosensitive printing element when the smoothing or roughening roller comes into contact with the cured photosensitive material of the flexographic photosensitive printing element and wherein the smoothing or roughening roller is not in contact with any portion of the absorbent material at the point where such absorbent material comes into contact with the cured photosensitive material of the flexographic photosensitive printing element.

2. The apparatus according to claim 1 comprising additional heating means for heating the printing element.

3. The apparatus according to claim 1 further comprising means for continuously conveying the absorbent material over at least a portion of the heatable roller.

4. The apparatus according to claim 1 wherein the smoothing or roughening roller contacts the printing element before the printing element contacts the heatable roller.

5. The apparatus according to claim 1 wherein the smoothing or roughening roller contacts the printing element after the printing element contacts the heatable roller.

6. The apparatus according to claim 1 wherein the smoothing or roughening roller is heated.

7. The apparatus according to claim 6 wherein the smoothing or roughening roller is electrically heated.

8. The apparatus according to claim 1 wherein the smoothing or roughening roller is coated with a resilient surface.

9. The apparatus according to claim 8 wherein the resilient surface is comprised of rubber.

10. The apparatus according to claim 8 wherein the resilient surface is comprised of a fluorinated polymer.

11. The apparatus according to claim 8 wherein the resilient surface is comprised of a fluorinated polymer/rubber composite.

12. The apparatus according to claim 1 wherein the effect of the smoothing or roughening roller changes the arithmetical mean roughness of the surface of the printing element by 10-2000 nm.

13. The apparatus according to claim 1 wherein the effect of the smoothing or roughening roller changes the arithmetical mean roughness of the surface of the printing element by 100-1000 mm.

14. The apparatus according to claim 1 wherein the effect of the smoothing or roughening roller changes the arithmetical mean roughness of the surface of the printing element by 150-600 nm.

15. The apparatus according to claim 1 wherein the smoothing or roughening roller is driven by a motor.

16. The apparatus according to claim 1 wherein a pneumatic cylinder controls the position of the smoothing or roughening roller.

17. A method of forming a relief structure on a flexographic photosensitive printing element, wherein the flexographic photosensitive printing element comprises a flexible substrate and at least one layer of photosensitive material comprising cured photosensitive material and uncured photosensitive material on the flexible substrate, the method comprising the steps of:
   (i) providing an enclosure;
   (ii) providing conveying means comprising a continuous loop, upon which the flexographic photosensitive printing element is supported by the conveying means with the flexible substrate in contact with the conveying means;
   (iii) providing a mounted heatable roller in the enclosure;
   (iv) providing an absorbent material to at least a portion of the heatable roller, wherein the absorbent material absorbs liquefied or softened uncured photosensitive material from the flexographic photosensitive printing element when the flexographic photosensitive printing element comes into contact with the absorbent material on a portion of the heatable roller;
   (v) causing the flexographic photosensitive printing element to come into contact with the absorbent material between the conveying means and the heatable roller;
   (vi) heating the heatable roller to a temperature that causes the uncured photosensitive material to liquefy or soften when contact between the heatable roller, the absorbent material and the flexographic photosensitive printing element is made;
   (vii) causing the same side of the flexographic photosensitive printing element that contacted the absorbent material to contact a smoothing or roughening roller that changes the surface roughness of the cured photosensitive material of the flexographic photosensitive printing element, wherein this contact does not occur at the point where the absorbent material contacts the flexographic photosensitive printing element.

18. The method according to claim 17 comprising providing further heating means to heat the printing element.

19. The method according to claim 17 further comprising the step of continuously conveying the absorbent material over at least a portion of the heatable roller.

20. The method according to claim 17 wherein contacting the smoothing or roughening roller occurs before the printing element contacts the heatable roller.

21. The method according to claim 17 wherein contacting the smoothing or roughening roller occurs after the printing element contacts the heatable roller.

22. The method according to claim 17 wherein the smoothing or roughening roller is heated.

23. The method according to claim 17 wherein the smoothing or roughening roller is coated with a resilient surface.

24. The method according to claim 23 wherein the resilient surface is comprised of rubber.

25. The method according to claim 23 wherein the resilient surface is comprised of fluorinated polymer.

26. The method according to claim 23 wherein the resilient surface is comprised of a fluorinated polymer/rubber composite.

27. The method according to claim 17 wherein the smoothing or roughening roller changes the arithmetical mean roughness of the surface of the printing element by 10-2000 nm.

28. The method according to claim 17 wherein the smoothing or roughening roller changes the arithmetical mean roughness of the surface of the printing element by 100-1000 nm.

29. The method according to claim 17 wherein the smoothing or roughening roller changes the arithmetical mean roughness of the surface of the printing element by 150-600 nm.

30. The method according to claim 17 wherein a pneumatic cylinder controls the position of the smoothing or roughening roller.

31. The method according to claim 17 wherein the smoothing or roughening roller is driven by a motor.

32. A method of forming a relief structure on a flexographic photosensitive printing element, wherein the flexographic photosensitive printing element comprises cured photosensitive material and uncured photosensitive material on a flexible substrate, the method comprising the steps of:
(i) providing an enclosure:
(ii) providing conveying means comprising a continuous loop, upon which the flexographic photosensitive printing element is supported by the conveying means with the flexible substrate in contact with the conveying means;
(iii) developing the flexographic photosensitive printing element to remove the uncured photosensitive material;
(iv) conveying the developed flexographic photosensitive printing element on said conveying means such that the flexible substrate is in contact with the conveying means and the face of the photosensitive printing element opposite the flexible substrate comes into contact with at least one smoothing or roughening roller thereby changing the surface roughness of the cured photosensitive material of the photosensitive printing element, wherein said contact does not occur at a point where any absorbent material contacts the photosensitive printing element.

33. A method according to claim 32 wherein the at east one smoothing or roughening roller is heated.

34. The method according to claim 32 wherein the smoothing or roughening roller is coated with a resilient surface.

35. The method according to claim 34 wherein the resilient surface is comprised of rubber.

36. The method according to claim 34 wherein the resilient surface is comprised of fluorinated polymer.

37. The method according to claim 34 wherein the resilient surface is comprised of a fluorinated polymer/rubber composite.

38. The method according to claim 32 wherein the smoothing or roughening roller changes the arithmetical mean roughness of the surface of the printing element by 10-2000 nm.

39. The method according to claim 32 wherein the smoothing or roughening roller changes the arithmetical mean roughness of the surface of the printing element by 100-1000 nm.

40. The method according to claim 32 wherein the smoothing or roughening roller changes the arithmetical mean roughness of the surface of the printing element by 150-600 nm.

41. The method according to claim 32 wherein the smoothing or roughening roller is driven by a motor.

42. The method according to claim 32 wherein a pneumatic cylinder controls the position of the smoothing or roughening roller.

* * * * *

UNITED STATES PATENT AND TRADEMARK OFFICE
CERTIFICATE OF CORRECTION

| | | |
|---|---|---|
| PATENT NO. | : 8,739,701 B2 | Page 1 of 1 |
| APPLICATION NO. | : 12/183461 | |
| DATED | : June 3, 2014 | |
| INVENTOR(S) | : Ryan Vest et al. | |

It is certified that error appears in the above-identified patent and that said Letters Patent is hereby corrected as shown below:

In the Claims:

Column 12, Line 13

Delete "the at east one," and replace it with -- the at least one --

Signed and Sealed this
Ninth Day of September, 2014

Michelle K. Lee
*Deputy Director of the United States Patent and Trademark Office*